(12) United States Patent
Kawaguchi et al.

(10) Patent No.: US 6,236,085 B1
(45) Date of Patent: *May 22, 2001

(54) SEMICONDUCTOR MEMORY DEVICE HAVING HIGH-CONCENTRATION REGION AROUND ELECTRIC-FIELD MODERATING LAYER IN SUBSTRATE

(75) Inventors: Tsutomu Kawaguchi, Nagoya; Mitsutaka Katada, Toyokawa, both of (JP)

(73) Assignee: Denso Corporation, Kariya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/966,707

(22) Filed: Nov. 10, 1997

(30) Foreign Application Priority Data

Nov. 11, 1996 (JP) ..................................................... 8-299052
Nov. 11, 1996 (JP) ..................................................... 8-299053

(51) Int. Cl.[7] .................................................. H01L 29/76
(52) U.S. Cl. ......................... 257/345; 257/315; 257/316; 257/318; 257/319; 257/320; 257/321; 257/322; 257/336; 257/344; 257/408; 257/900
(58) Field of Search ..................................... 257/315, 316, 257/408, 336, 321, 345, 344, 322, 318, 319, 320, 900

(56) References Cited

U.S. PATENT DOCUMENTS

| | | | |
|---|---|---|---|
| 4,769,686 | 9/1988 | Horiuchi et al. ...................... | 257/384 |
| 4,914,492 | 4/1990 | Matsumoto ........................... | 257/345 |
| 5,045,916 | 9/1991 | Vor et al. ............................. | 257/383 |
| 5,061,975 | 10/1991 | Inuishi et al. . | |
| 5,147,811 | 9/1992 | Sakagami . | |
| 5,189,497 | 2/1993 | Komori et al. . | |
| 5,190,887 | 3/1993 | Tang et al. . | |

(List continued on next page.)

FOREIGN PATENT DOCUMENTS

| | | |
|---|---|---|
| 53-97381 | 8/1978 | (JP) . |
| 58-148448 | 9/1983 | (JP) . |
| 61-226968 | 10/1986 | (JP) . |

(List continued on next page.)

OTHER PUBLICATIONS

Yoshikawa et al: A Reliable Profiled Lightly Doped Drain (PLD) Cell for High–Density Submicrometer EPROM's and Flash EEPROM's IEEE Transactions on Electron Devices, vol. 37, No. 4, Apr. 1990, pp. 999–1006.

* cited by examiner

*Primary Examiner*—Carl Whitehead, Jr.
*Assistant Examiner*—Matthew E. Warren
(74) *Attorney, Agent, or Firm*—Pillsbury Madison & Sutro LLP

(57) ABSTRACT

A semiconductor memory device comprising a source and a drain formed in a P-type semiconductor substrate and a floating gate and a control gate constituting a two-layer gate. Electric-field moderating layer is provided in the P-type semiconductor substrate to contact with a side face of the drain. P-type region is formed in contact with channel region side surface and bottom surface of the electric-field moderating layer. P-type region lower part of the P-type region in contact with the bottom surface of the electric-field moderating layer is given a lower impurity concentration than P-type region side part formed at the channel region side of the electric-field moderating layer. By this means it is possible to increase the writing speed of the semiconductor memory device while suppressing delay in the switching speed during reading operation.

10 Claims, 17 Drawing Sheets

U.S. PATENT DOCUMENTS

| | | |
|---|---|---|
| 5,194,749 | 3/1993 | Meguro et al. .......................... 257/69 |
| 5,208,175 | 5/1993 | Choi et al. . |
| 5,216,272 * | 6/1993 | Kubokoya et al. ................... 257/409 |
| 5,217,910 | 6/1993 | Shimizu et al. . |
| 5,247,198 | 9/1993 | Homma et al. . |
| 5,334,870 | 8/1994 | Katada et al. . |
| 5,424,567 * | 6/1995 | Chen .................................... 257/315 |
| 5,444,282 | 8/1995 | Yamaguchi et al. . |
| 5,477,072 * | 12/1995 | Goo ..................................... 257/316 |
| 5,486,487 | 1/1996 | Ginami et al. ....................... 438/291 |
| 5,492,847 | 2/1996 | Kao et al. . |
| 5,532,176 | 7/1996 | Katada . |
| 5,578,509 * | 11/1996 | Fujita .................................... 437/35 |
| 5,585,293 * | 12/1996 | Sharma et al. ....................... 257/316 |
| 5,612,914 * | 3/1997 | Liu et al. ............................. 257/315 |
| 5,629,541 | 5/1997 | Komori et al. . |
| 5,650,340 * | 7/1997 | Burr et al. ............................ 437/30 |
| 5,656,522 | 8/1997 | Komori et al. . |
| 5,656,839 | 8/1997 | Komori et al. . |
| 5,691,560 * | 11/1997 | Sakakibara ........................... 257/316 |
| 5,753,556 | 5/1998 | Katada . |
| 5,780,902 * | 7/1998 | Komuro ................................ 257/344 |

FOREIGN PATENT DOCUMENTS

| | | |
|---|---|---|
| 64-037055 | 2/1989 | (JP) . |
| 1-120870 | 5/1989 | (JP) . |
| 2-174271 | 7/1990 | (JP) . |
| 3-262130 | 11/1991 | (JP) . |
| 4-211178 | 8/1992 | (JP) . |
| 5-136423 | 6/1993 | (JP) . |
| 5-291538 | 11/1993 | (JP) . |
| 5-299662 | 11/1993 | (JP) . |
| 5-326968 | 12/1993 | (JP) . |
| 5-326974 | 12/1993 | (JP) . |
| 6-188431 | 7/1994 | (JP) . |
| 6-237004 | 8/1994 | (JP) . |
| 8-148585 | 6/1996 | (JP) . |

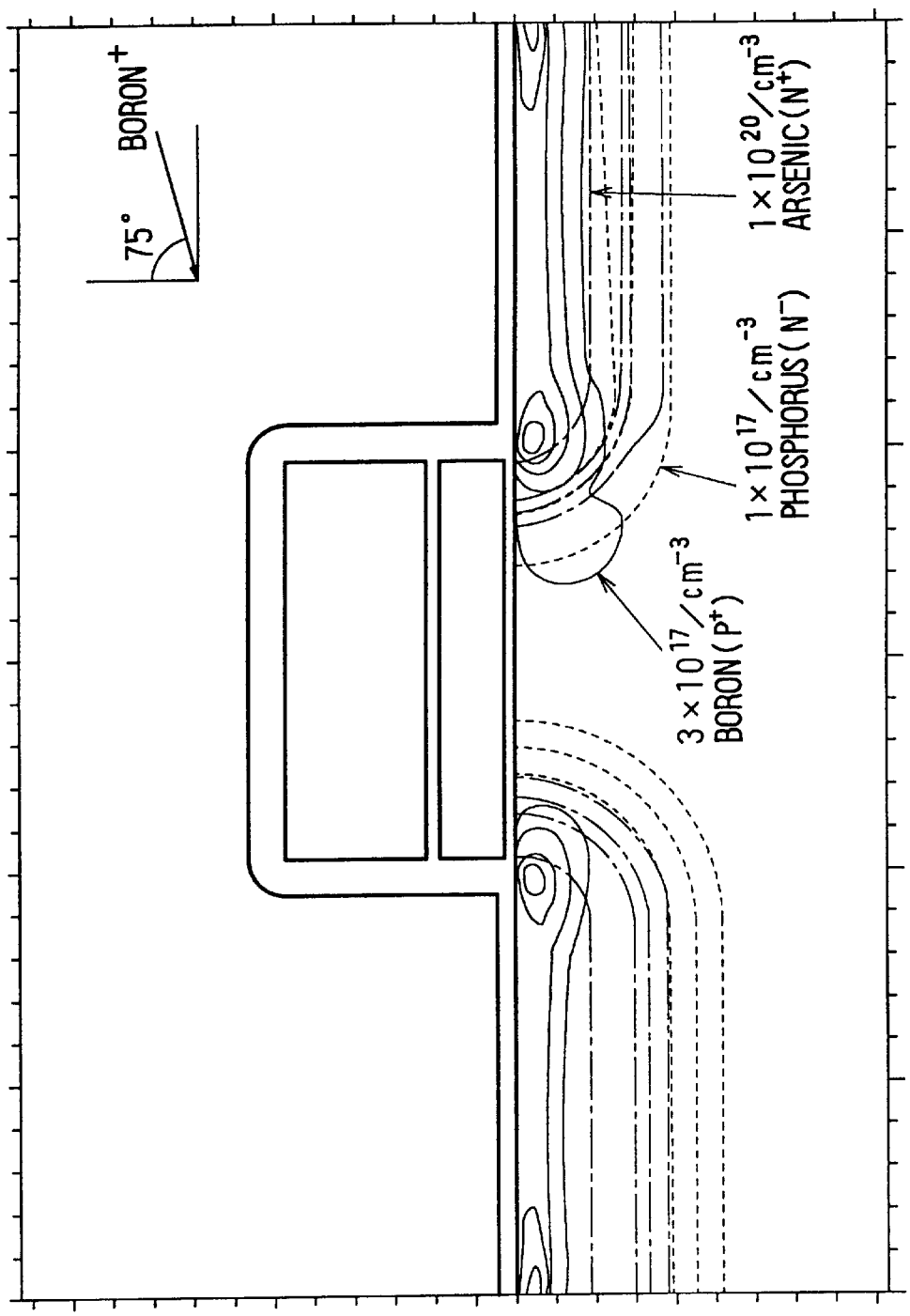

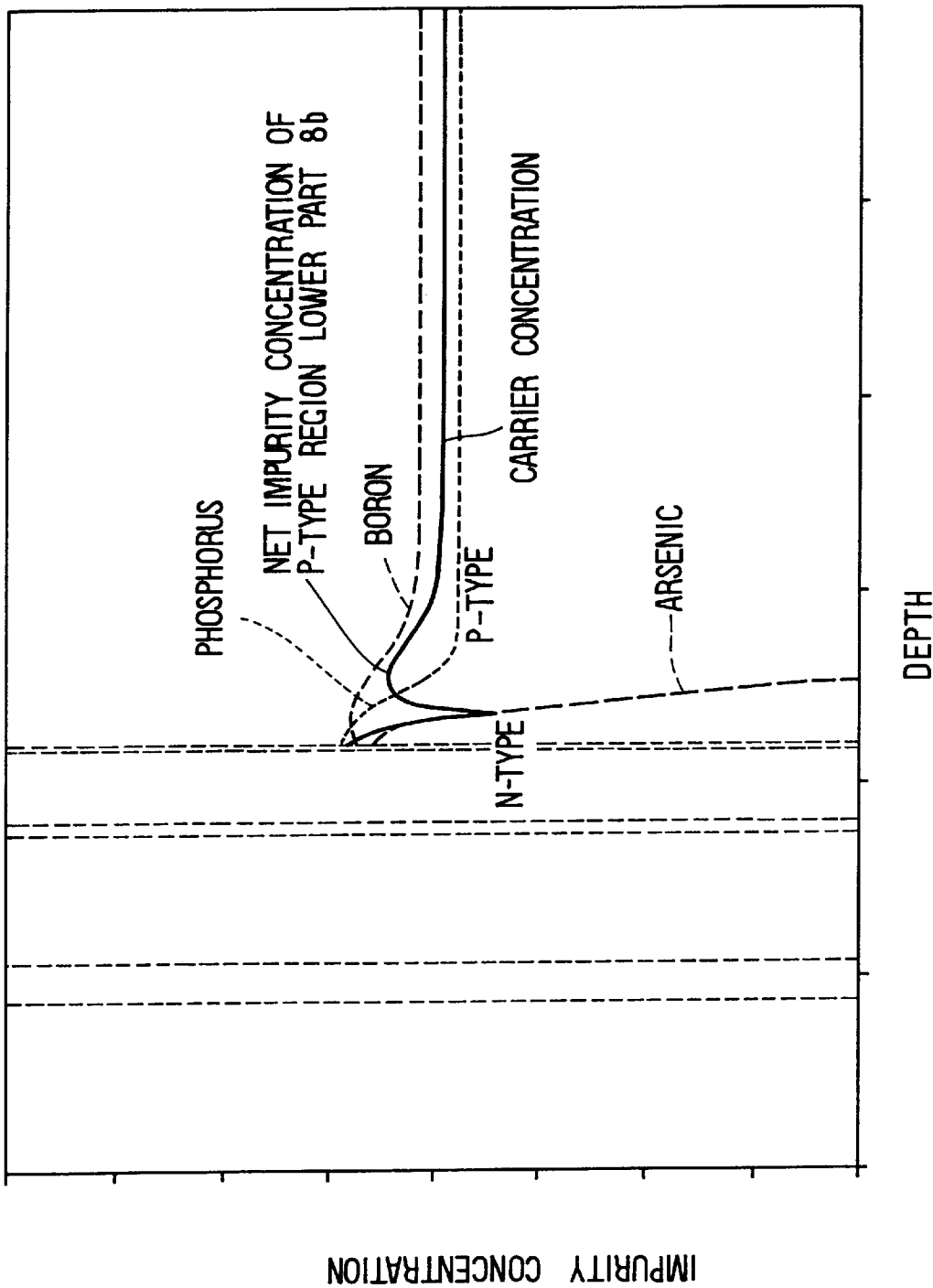

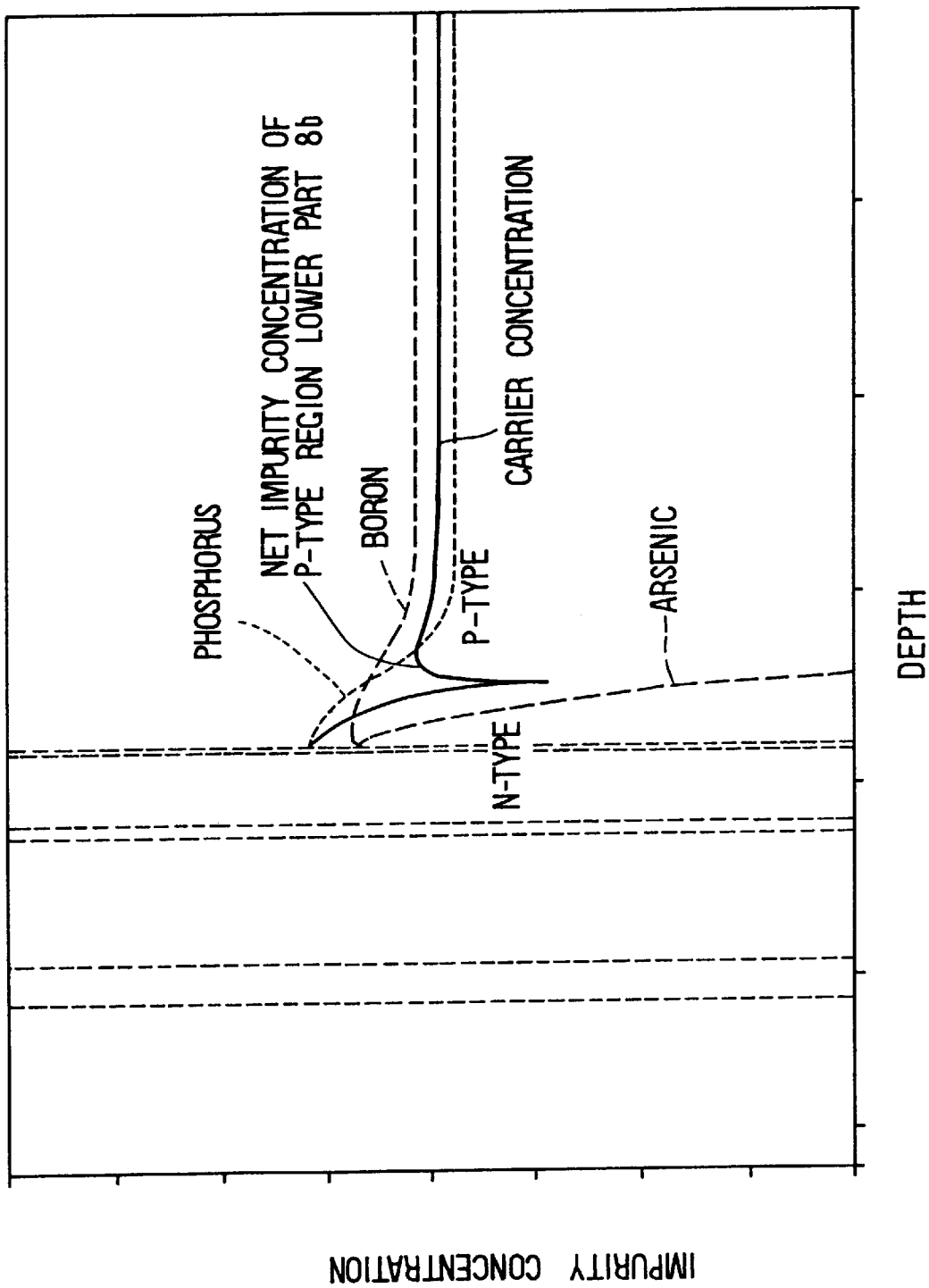

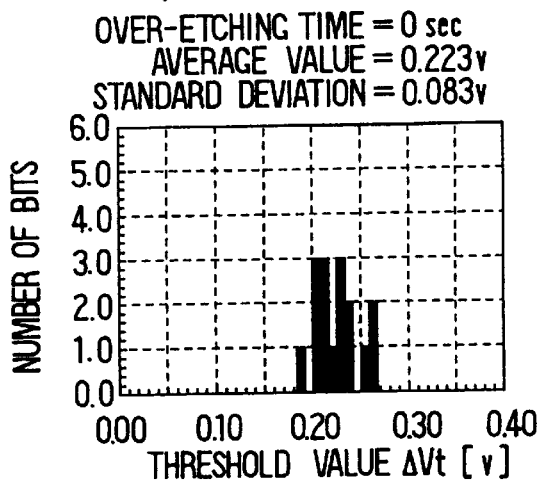

FIG. 15A
OVER-ETCHING TIME = 0 sec
AVERAGE VALUE = 0.223v
STANDARD DEVIATION = 0.083v

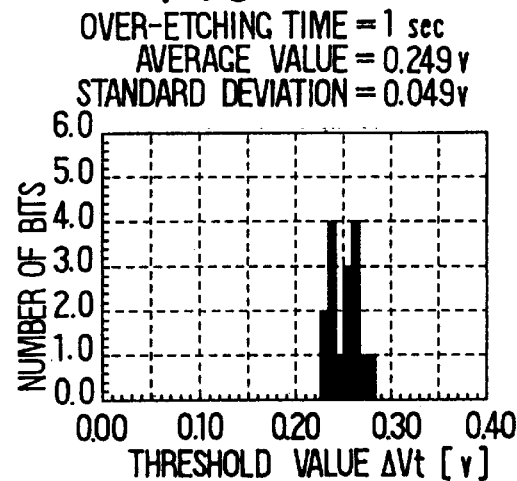

FIG. 15B
OVER-ETCHING TIME = 1 sec
AVERAGE VALUE = 0.249v
STANDARD DEVIATION = 0.049v

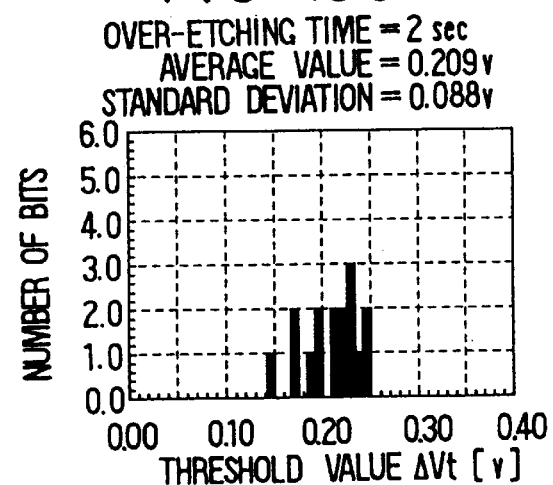

FIG. 15C
OVER-ETCHING TIME = 2 sec
AVERAGE VALUE = 0.209v
STANDARD DEVIATION = 0.088v

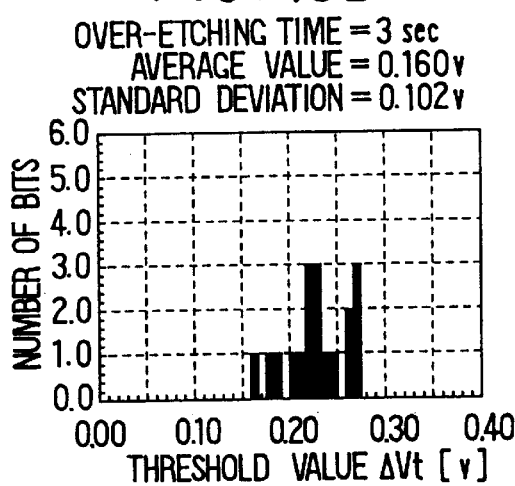

FIG. 15D
OVER-ETCHING TIME = 3 sec
AVERAGE VALUE = 0.160v
STANDARD DEVIATION = 0.102v

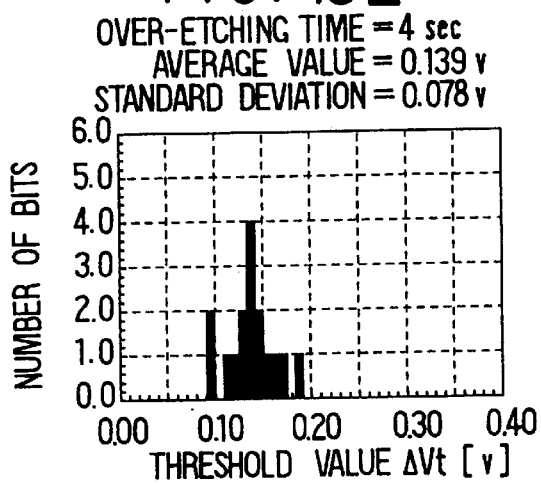

FIG. 15E
OVER-ETCHING TIME = 4 sec
AVERAGE VALUE = 0.139v
STANDARD DEVIATION = 0.078v

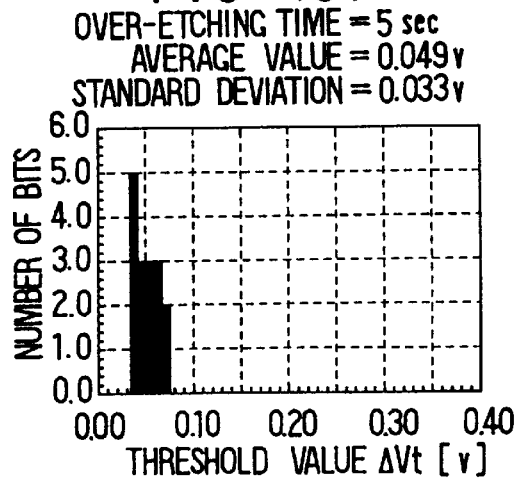

FIG. 15F
OVER-ETCHING TIME = 5 sec
AVERAGE VALUE = 0.049v
STANDARD DEVIATION = 0.033v

SEMICONDUCTOR MEMORY DEVICE HAVING HIGH-CONCENTRATION REGION AROUND ELECTRIC-FIELD MODERATING LAYER IN SUBSTRATE

CROSS REFERENCE TO RELATED APPLICATION

This application is based upon and claims the benefit of priority of prior Japanese Patent Applications No. H. 8-299052 filed on Nov. 11, 1996 and No. H. 8-299053 filed on Nov. 11, 1996, the contents of which are incorporated herein by reference.

BACKGROUND OF THE INVENTION

1. Field of the Invention

This invention relates to a MIS (Metal Insulator Semiconductor) transistor type nonvolatile semiconductor memory device having a two-layer electrode structure made up of a floating gate and a control gate. In particular, the invention can be preferably realized as a MOS (Metal Oxide Semiconductor) transistor type nonvolatile semiconductor memory device.

2. Description of Related Art

In nonvolatile semiconductor memory devices such as EEPROMs and flash memories, high-concentration P-type regions called P-pockets are formed around electric-field moderating layers and the source and the drain to increase writing speed by increasing the efficiency of formation of hot carriers during writing operation.

A conventional nonvolatile semiconductor memory device is manufactured by the steps illustrated in FIGS. 12A through 12D. Specifically, a floating gate 3 is formed on a P-well region 1 formed in a substrate, with a first gate insulating film 2 therebetween. Then, a control gate 5 is formed on the floating gate 3, with a second gate insulting film 4 therebetween. After that, an oxide film 6 is formed to a suitable thickness and N-type impurity is ion-implanted to form a source 6a and a drain 6b, as shown in FIG. 12B. Also, an N-type impurity is diagonally ion-implanted to form electric-field moderating layers 7, as shown in FIG. 12C. Next, boron is diagonally ion-implanted and high-concentration P-type regions 8a, 8b called P-pockets are formed around the electric-field moderating layers 7 and next to the lower parts of the source 6a and the drain 6b, as shown in FIG. 12D.

However, when a nonvolatile semiconductor memory device is manufactured in the way described above, the high-concentration P-type region 8b is formed in contact with the bottom surface of the electric-field moderating layer 7 and the lower part of the drain 6b. As a result, the width of a depletion layer formed between the N-type regions of the electric-field moderating layer 7 and the drain 6b and the high-concentration P-type region 8b becomes narrow and the diffusion capacitance of this P-N junction increases. This increase in capacitance lengthens the time required for charging and discharging of charges, and consequently the switching speed of when reading operation of the semiconductor memory device is carried out is made slow.

It is therefore a first object of the invention to provide a semiconductor memory device and a method for manufacturing the same with which it is possible to suppress a delay in switching speed while quickening writing speed by eliminating the influence of a high-concentration region of the opposite conductive type formed adjacent to the bottom surface of an electric-field moderating layer and lower parts of source and drain layers.

One example of known nonvolatile memories in which electrical overwriting and erasing are possible is a flash memory. Generally, as shown in FIG. 18, a flash memory 100 consists of a large number of bits arrayed in a matrix. When reading and writing operations are carried out in this kind of flash memory 100, a voltage acts on the terminals of bits other than the selected bit (hereinafter referred to as non-selected bits) as well on the selected bit. Consequently, it sometimes happens that in non-selected bits charge is exchanged between the charge holding part of the bit and the terminal on which the voltage acts and data that had been held in the bit is lost as a result.

This phenomenon is called disturbance in a nonvolatile memory. A particular type of this disturbance is drain disturbance, which occurs when a voltage acts on the drain. Because the drain side edge of the gate electrode is square, a field concentration arises at this edge, and drain disturbance is sometimes caused with this as the reason.

To avoid this, as disclosed in Japanese Patent Application Laid-Open No. H. 5-299662 and Japanese Patent Application Laid-Open No. H. 6-237004, methods for suppressing drain disturbance by rounding off the drain side edge of a floating gate constituting the charge holding part so that a field concentration does not arise there are known. In the method disclosed in Japanese Patent Application No. H. 6-237004, a first insulating film, a polysilicon layer, a second insulating film and another polysilicon layer are formed and then anisotropic dry etching is carried out vertically as far as midway through the first insulating film. The etched side wall parts are then covered with a protecting film and isotropic etching is carried out to round both of the bottom edges of the floating gate. In the method disclosed in Japanese Patent Application Laid-Open No. H. 5-299662, a first insulating film, a polysilicon layer, a second insulating film and another polysilicon layer formed successively are anisotropically dry-etched vertically to form a gate oxide film, a floating gate, another gate oxide film and a control gate are formed. Then, with a source side region masked, the gate oxide film on the drain side is isotropically etched and the floating gate edge on the drain side is thereby exposed. After that, rounding of the drain side edge of the floating gate is carried out by thermal oxidation.

However, in these methods, the process of rounding the drain side edge of the floating gate carried out to suppress drain disturbance necessitates etching steps of anisotropic dry etching and isotropic etching.

It is therefore a second object of the invention to provide a manufacturing method by which it is possible to fabricate a two-layer gate type semiconductor memory device with which drain disturbance can be suppressed without isotropically etching the gate oxide film on the drain side.

SUMMARY OF THE INVENTION

To achieve the above-mentioned first object, a semiconductor memory device provided by the present invention has formed on a semiconductor substrate a source and a drain of a second conductive type, a two-layer gate electrode, an electric-field moderating layer and a first conductive type region formed in contact with a side surface (channel region side) and a bottom surface of the electric-field moderating layer. The first conductive type region in contact with the bottom surface of the field-moderating layer is formed with a lower substantial impurity concentration than that of the first conductive type region formed at the channel region side of the field-moderating layer.

Because the substantial impurity concentration of the first conductive type region in contact with the bottom surface of the electric-field moderating layer is made lower than the impurity concentration of the first conductive type region at the channel region side of the electric-field moderating layer, it is possible to suppress narrowing of the width of a depletion layer formed between both the electric-field moderating layer and the drain and the first conductive type region in contact with the bottom surface of the field-moderating layer and thereby prevent increase of a diffusion capacitance. By this means it is possible to quicken writing speed while suppressing a delay in switching speed in the semiconductor memory device.

A semiconductor memory device according to the present invention can be manufactured by the following procedure. First, a two-layer gate electrode is formed on a semiconductor substrate and then a source and a drain are formed. Then, diagonal ion implantation of a second conductive type impurity is carried out at a first angle ($\theta_1$) to the vertical to the semiconductor substrate surface to form an electrical-field moderating layer. Also, diagonal ion implantation of a first conductive type impurity is carried out at a second angle ($\theta_2$) greater than the first angle ($\theta_1$) to form a first conductive type region in contact with the channel region side and the bottom surface of the electrical-field moderating layer.

When diagonal ion implantation is carried out at a second angle ($\theta_2$) greater than the first angle ($\theta_1$) in this way, ions are implanted into a region at the channel region side of the electric-field moderating layer in a large quantity while ions are only implanted into the region in contact with the bottom surface of the electric-field moderating layer in a small quantity. As a result, it is possible to make the substantial impurity concentration of the first conductive type region in contact with the bottom surface of the electric-field moderating layer thinner than that of the first conductive type region at the channel region side of the electric-field moderating layer.

Also, diagonal ion implantation of an impurity of the second conductive type may be carried out at a third angle ($\theta_3$) smaller than the second angle ($\theta_2$) to lower the substantial impurity concentration of the first conductive type region formed in contact with the bottom surface of the electric-field moderating layer. By carrying out diagonal ion implantation of a second conductive type impurity at a third angle ($\theta_3$) smaller than the second angle ($\theta_2$) in this way it is possible to cancel the impurity of the first conductive type implanted into the region formed in contact with the bottom surface of the electric-field moderating layer and thereby lower the substantial impurity concentration there. By this means it is possible to lower the impurity concentration of the first conductive type region in contact with the bottom surface of the electric-field moderating layer more completely.

To achieve the above-mentioned second object, in a method for manufacturing a semiconductor memory device provided by the present invention, first, a first insulating film, a first gate electrode layer, a second insulating film, a second gate electrode layer and a resist film are successively formed on a substrate. Then, etching is carried out with the resist film as a mask and from the second gate electrode layer to the first insulating film are thereby removed so as to completely expose at least the substrate on the drain side. After that, the drain side edge of a floating gate which is consisting of polysilicon and formed from the first gate electrode layer is rounded by thermal oxidation.

By etching being carried out so as to completely expose at least the substrate on the drain side in this way, in one etching step the edge of the floating gate is over-etched. By this means it is possible to reduce variation of threshold voltage overall and improve drain disturbance characteristic in a two-layer gate type semiconductor memory device.

BRIEF DESCRIPTION OF THE DRAWINGS

This and other objects, features and characteristics of the present invention will be appreciated from a study of the following detailed description, the appended claims, and drawings, all of which form a part of this application. In the drawings:

FIG. 7 is a view showing a distribution of ions when implantation of boron ions has been carried out at an angle of $\theta_2=75°$;

FIG. 10 is a view illustrating ion concentrations in a flash memory transistor before phosphorus ion implantation;

FIG. 11 is a view illustrating ion concentrations after phosphorus ion implantation;

FIGS. 15A through 15F are graphs of threshold voltage for different over-etching times in a 16-bit two-layer gate type semiconductor memory device;

DETAILED DESCRIPTION OF THE PREFERRED EMBODIMENTS

The invention will now be described on the basis of preferred embodiments shown in the accompanying drawings.

(First Preferred Embodiment)

Figure 1:
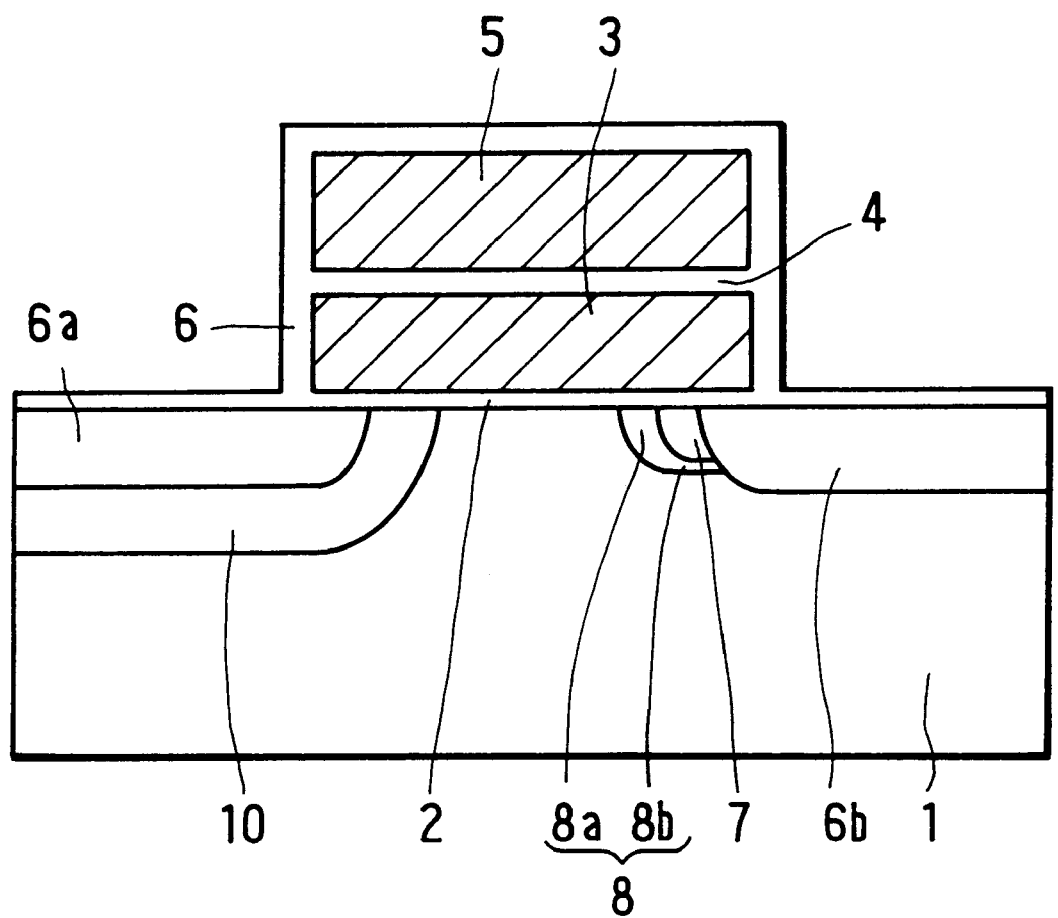
FIG. 1 is a sectional view of a semiconductor device of a first preferred embodiment of the present invention.

FIG. 1 shows a first preferred embodiment of the invention applied to a flash memory transistor. FIGS. 2A through 2F are process views illustrating a procedure for manufacturing the flash memory transistor in FIG. 1. A method for manufacturing a flash memory transistor in this preferred embodiment will now be described on the basis of these FIGS. 2A through 2F.

Figure 2A:
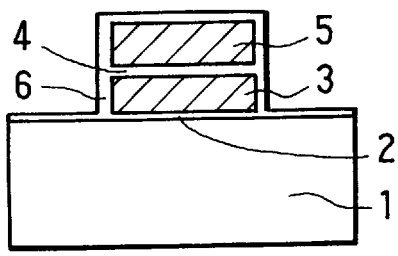
FIGS. 2A through 2F are process views illustrating a procedure for manufacturing a flash memory transistor in the first preferred embodiment.
Figure 2B:
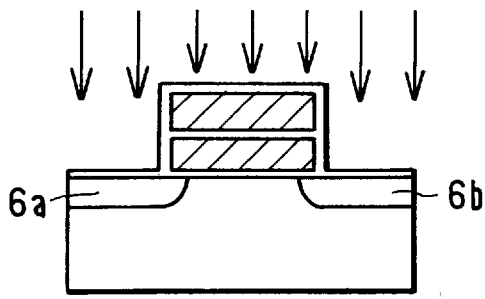
Figure 2C:
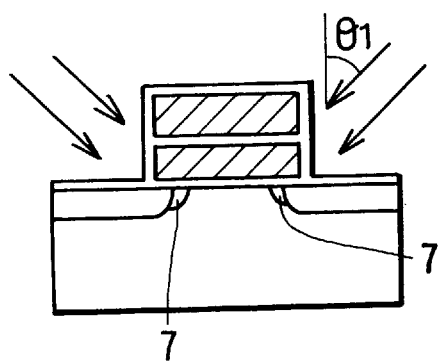

First, as shown in FIG. 2A, a first gate insulating film 2 and a floating gate 3 are formed on a P-type semiconductor substrate 1. Also, a second gate insulating film 4 and a control gate 5 are formed on the floating gate 3. Then, an oxide film 6 of a suitable thickness is formed on the surface of these gates. Next, as shown in FIG. 2B, with these gates as a mask, arsenic ions (an N-type impurity) are implanted from above to a relatively high concentration to form a source 6a and a drain 6b. Then, as shown in FIG. 2C, phosphorus ions (an N-type impurity) are diagonally implanted at a predetermined angle of $\theta_1=45°$ to the vertical direction of the substrate surface to a relatively low concentration to form electric-field moderating layers 7. Although in this preferred embodiment the first angle $\theta_1$ is made 45°, the predetermined angle $\theta_1$ can be set anywhere within a range of about 0° to 70°.

Figure 2D:
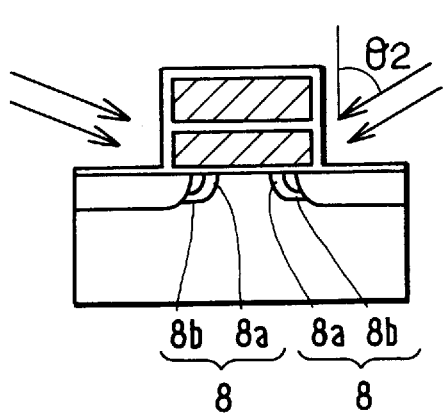

Also, as shown in FIG. 2D, boron ions (a P-type impurity) are diagonally implanted at an acceleration voltage of 70 keV and a dose of $1.1 \times 10^{14}/cm^{-3}$ and at a predetermined second angle $\theta_2=60°$ larger than the first angle $\theta_1$ to form P-type regions 8, called P-pockets, whose impurity concentration is higher than the substrate concentration, around the electric-field moderating layers 7. Although in this preferred embodiment the predetermined angle $\theta_2$ is made 60°, the predetermined angle $\theta_2$ can be set to an angle about 10° larger than the previously set angle $\theta_1$ anywhere within a range of about 10° to 80°.

Figure 2E:
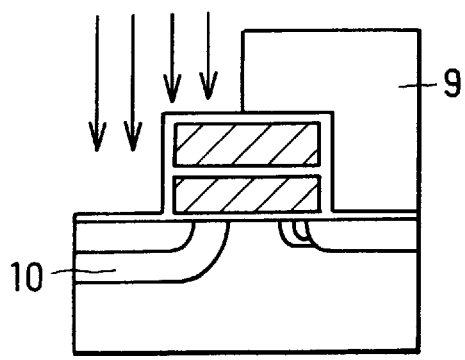

After that, as shown in FIG. 2E, the drain 6b side is covered with a photoresist and phosphorus ions are implanted into the source 6a side to form a source electric-field moderating layer 10 for securing a high source withstandable voltage. At this time, by the impurity concentration of the N-type source electric-field moderating layer 10 being made higher than the impurity concentration of the P-type region 8, the P-type region 8 on the source 6a side is cancelled.

Figure 2F:
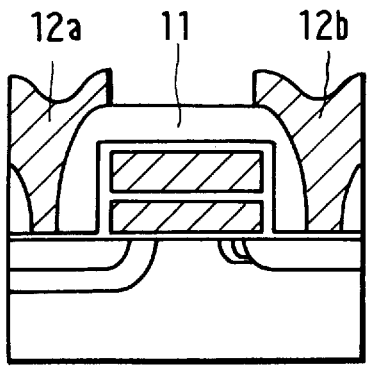

Next, heat treatment is carried out to diffuse (activate) the implanted ions. At this time, the impurity concentration of the P-type region (hereinafter referred to as the P-type region lower part) 8b below the electric-field moderating layer 7 is lower than the impurity concentration of the P-type region (hereinafter referred to as the P-type region side part) 8a at the channel region side of the electric-field moderating layer 7. After that, as shown in FIG. 2F, an interlayer insulating film 11 such as a BPSG film is formed over the entire substrate and then contact holes reaching the source 6a and the drain 6b are formed in the interlayer insulating film 11. A metal film such as an aluminum film is then formed by vapor deposition or sputtering or by chemical gas phase growth and patterned to form a source interconnection 12a and a drain interconnection 12b and a flash memory transistor is thereby completed.

Figure 3:
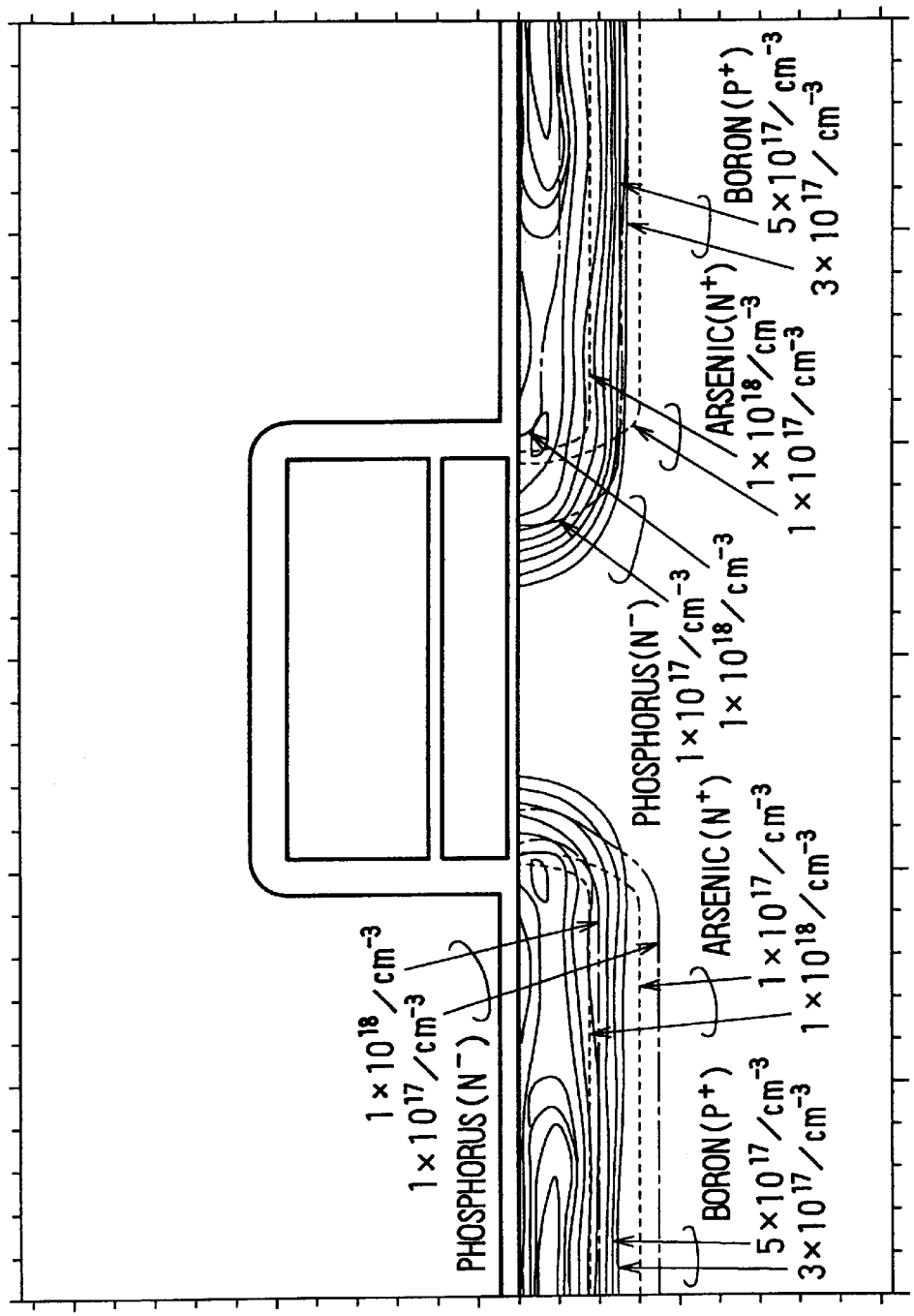
FIG. 3 is a view showing a distribution of ions in a substrate before heat treatment.
Figure 4:
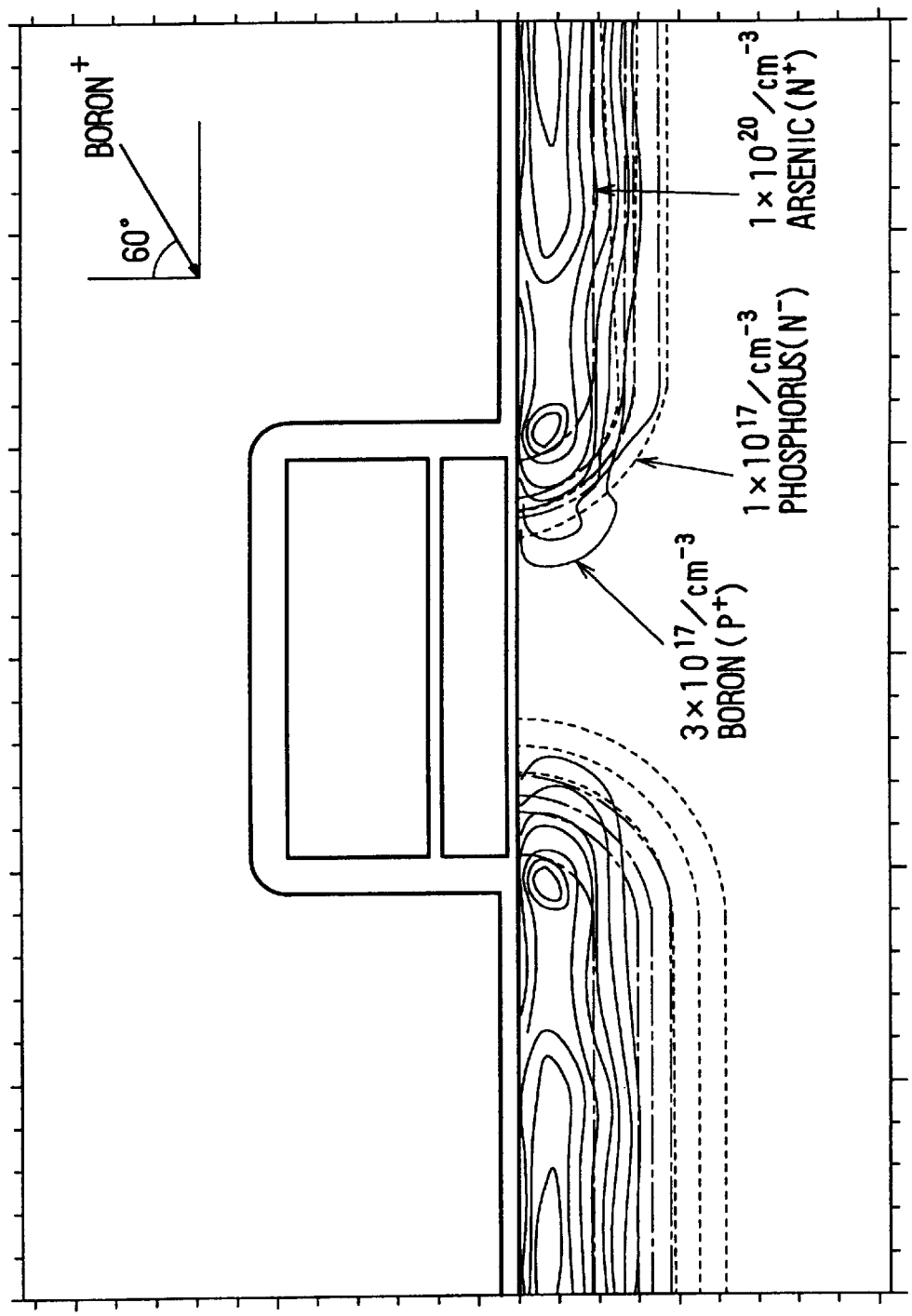
FIG. 4 is a view showing a distribution of ions after heat treatment.

A simulation analysis of the impurity concentration distribution of the P-type impurity when the phosphorus ion implantation was carried out at the angle $\theta_1=45°$ and the boron ion implantation was carried out at the angle $\theta_2=60°$ is shown in FIG. 3, and a simulation analysis of the impurity concentration distribution of the P-type impurity after the implanted boron ions are thermally diffused is shown in FIG. 4. In FIG. 3 and FIG. 4, the solid lines are isosbestic lines of boron, the dashed lines are isosbestic lines of phosphorus, and the broken lines are isosbestic lines of arsenic.

As shown in FIG. 4, the concentration of the P-type region lower parts 8b is lower than the concentration of the P-type region side parts 8a. Also, as shown in FIG. 3, immediately after the phosphorus ions and the boron ions are implanted, at the channel region side surfaces of the electric-field moderating layers 7 the quantity of boron ions having been implanted through the electric-field moderating layers 7 is large, and below the electric-field moderating layers 7 the quantity of boron ions having been implanted through the electric-field moderating layers 7 is small. Specifically looking at the concentration distribution of the ions implanted to form the P-type regions 8, whereas in the P-type region side parts 8a boron ions are present at a concentration higher than $13 \times 10^{17}/cm^{-3}$, in the P-type region lower parts 8b the concentration of boron ions is only $5 \times 10^{17}/cm^{-3}$.

Also, in the subsequent heat treatment, the boron ions also interact with N-type impurities such as phosphorus ions as they diffuse. Consequently, as shown in FIG. 4, there is also the effect that the boron ions present in the regions having a high concentration of N-type impurity, for example in the electric-field moderating layers 7, become less readily diffused to below the electric-field moderating layers 7. Because of this, the P-type region lower parts 8b are formed with a lower impurity concentration than the P-type region side parts 8a.

Figure 5:
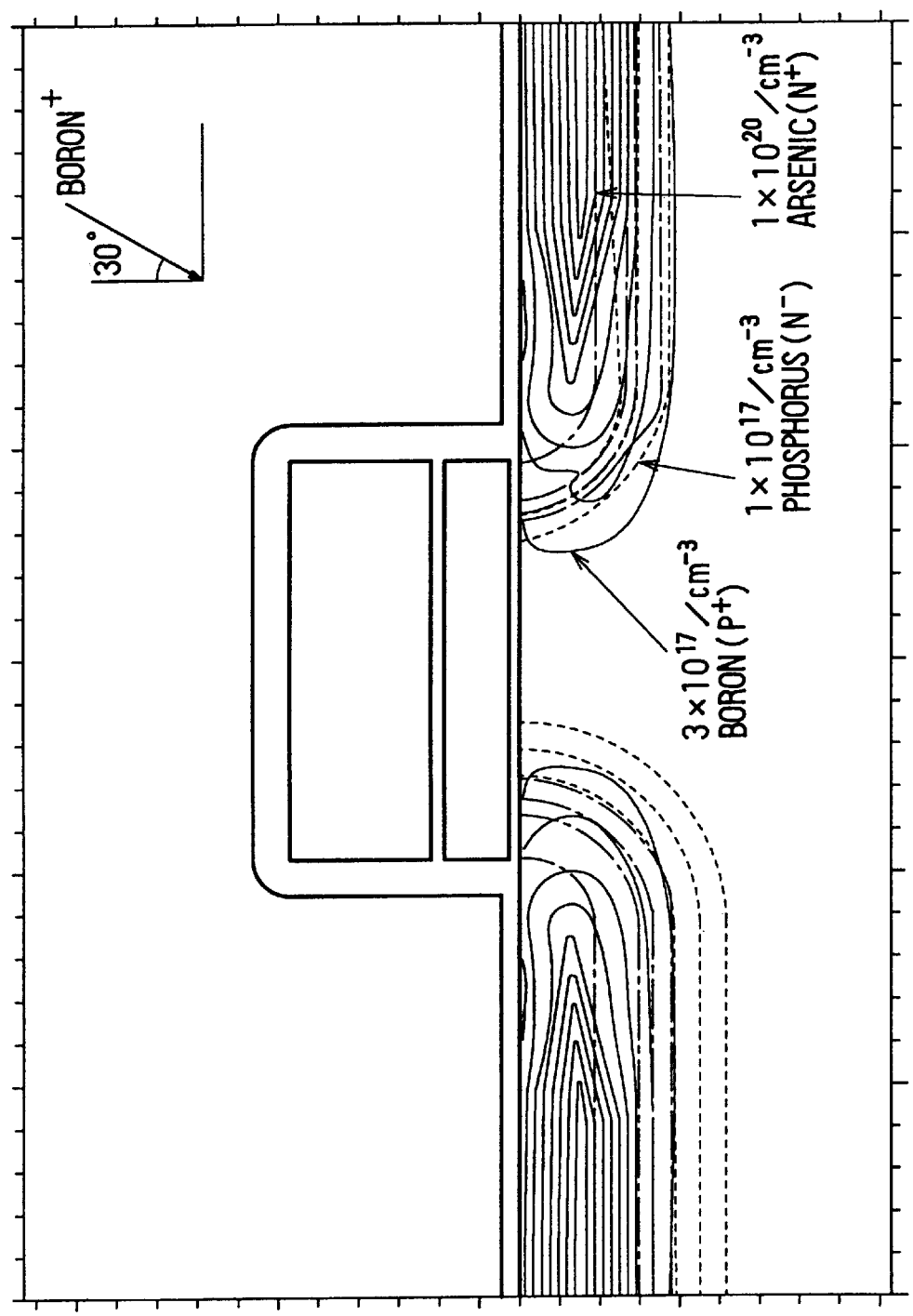
FIG. 5 is a view showing a distribution of ions when implantation of boron ions has been carried out at an angle of $\theta_2=30°$.
Figure 6:
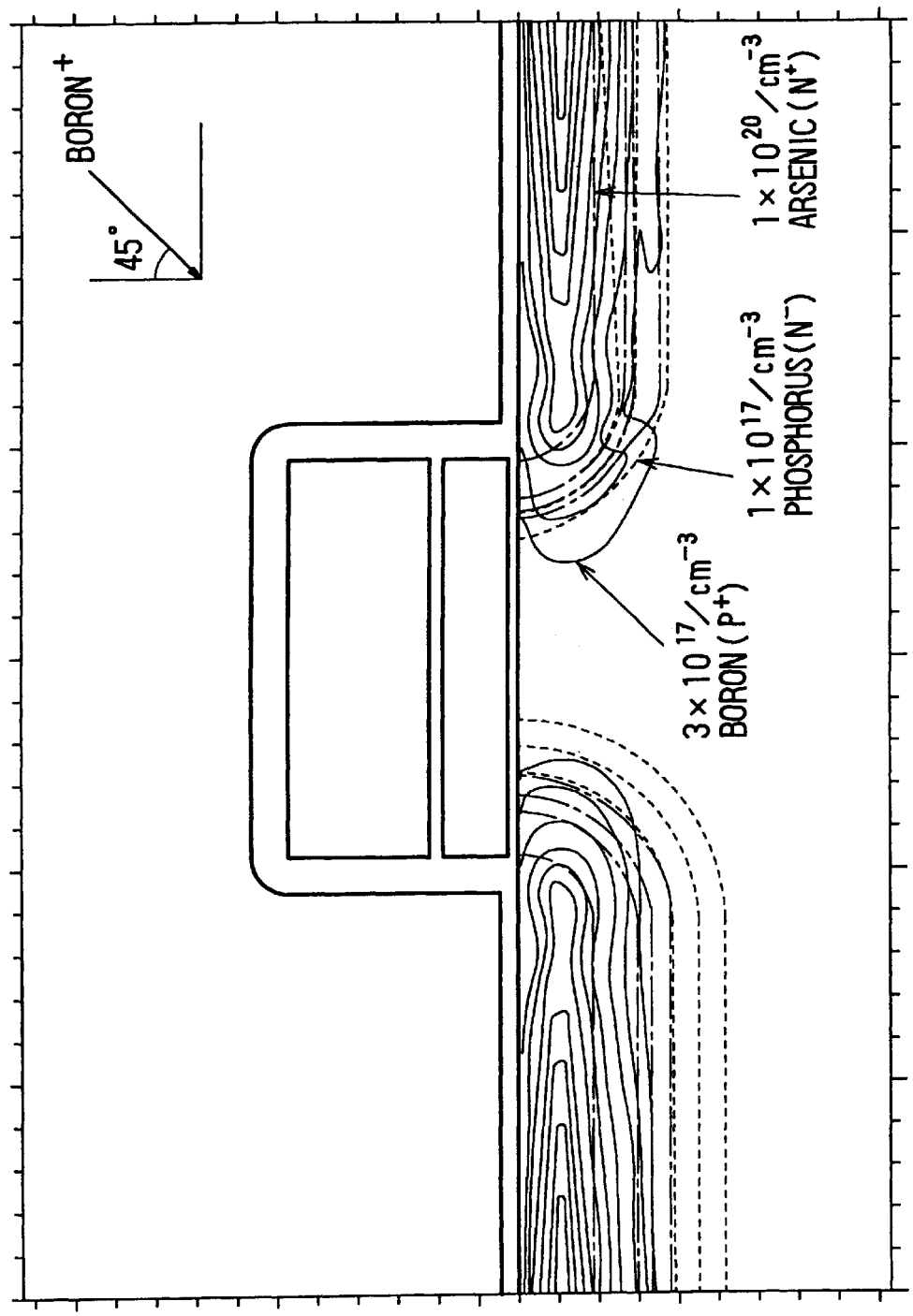
FIG. 6 is a view showing a distribution of ions when implantation of boron ions has been carried out at an angle of $\theta_2=45°$.

Also, the quantity of boron ions implanted through the electric-field moderating layers 7 changes depending on the sizes of the angles $\theta_1$ and $\theta_2$. A simulation analysis of the ion concentration distribution after the thermal diffusion for different angles $\theta_2$ of the boron ion implantation with the phosphorus ion implantation angle $\theta_1$ made 45° is shown in FIG. 5 through FIG. 7. In FIG. 5 the boron ion implantation angle $\theta_2$ is 30°, in FIG. 6 the angle $\theta_2$ is 45° and in FIG. 7 the angle $\theta_2$ is 75°.

When as shown in FIG. 5 the angle $\theta_1>$ the angle $\theta_2$, the boron ion concentrations of the P-type region lower parts 8b and the P-type region side parts 8a are the same. When as in FIG. 6 the angle $\theta_1=$the angle $\theta_2$, there are slightly fewer boron ions in the P-type region lower parts 8b than in the P-type region side parts 8a, but not few enough. When as in FIG. 7 the angle $\theta_1<$the angle $\theta_2$, on the other hand, the concentration of boron ions in the P-type region lower parts 8b is amply lower than the concentration of boron ions in the P-type region side parts 8a.

From the above simulation analysis it can be seen that when the angle $\theta_1$ is varied within the range of 0° to 70°, for the concentration of boron ions in the P-type region lower parts 8b to be lower than the concentration of boron ions in the P-type region side parts 8a, the angle $\theta_2$ must be made larger than the angle $\theta_1$.

Further, the depth to which the boron ions are implanted and the quantity of ions implanted are related to the acceleration voltage and the dose. Therefore, to form the P-type region side parts 8a, it is necessary to adjust the angle of incidence $\theta_2$ of the boron ion implantation, the acceleration voltage, and the dose.

Thus, in the flash memory transistor, because the concentration of the P-type region lower part 8b on the drain 6b side is kept low, increase of the diffusion capacitance between the electric-field moderating layers 7 and the P-type regions 8 is suppressed. Furthermore, at the channel region side, P-type region side part 8a having a concentration amply high enough to raise the rate of formation of hot carriers is formed. As a result, it is possible to increase the writing speed of the flash memory without slowing its switching speed.

(Second Preferred Embodiment)

A second preferred embodiment of the invention applied to a flash memory transistor is shown in FIGS. 8A through 8G, and a method for manufacturing a flash memory transistor of this preferred embodiment will now be described on the basis of these figures. Parts in this preferred embodiment the same as parts in the first preferred embodiment will not be described in the following.

Figure 8A:
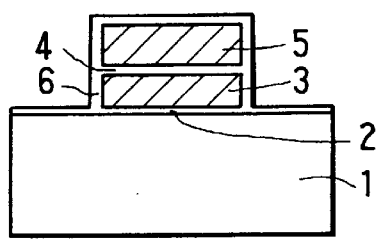
FIGS. 8A through 8G are process views illustrating a procedure for manufacturing a flash memory transistor in a second preferred embodiment.
Figure 8B:
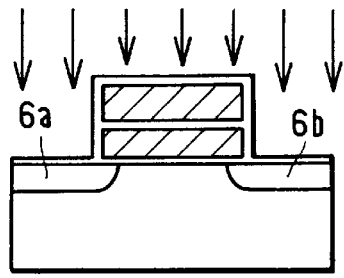
Figure 8C:
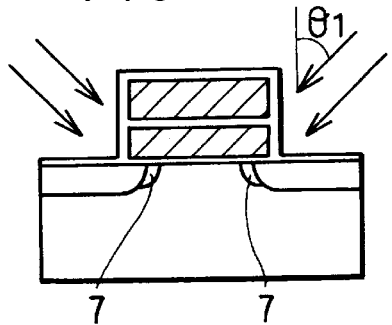
Figure 8D:
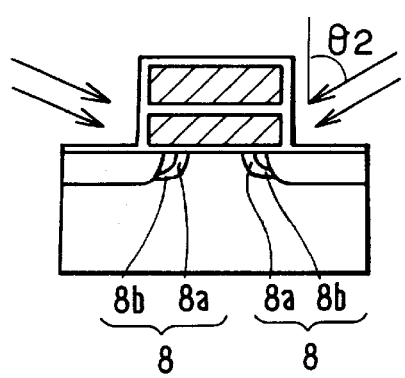

First, by the same procedure as that of the first preferred embodiment, shown in FIGS. 8A through 8D, P-type regions 8 of a higher concentration than the impurity concentration in the P-type semiconductor substrate 1 are formed, as shown in FIG. 8D. At this time, in the same way as in the first preferred embodiment, the P-type region lower parts 8b are formed with a lower concentration of boron ions than the P-type region side parts 8a.

Figure 8E:
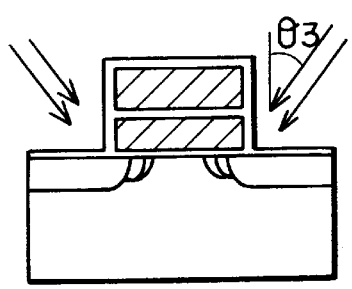

After that, as shown in FIG. 8E, an N-type impurity such as phosphorus or arsenic is diagonally ion implanted at a predetermined angle $\theta_3=45°$, smaller than the angle $\theta_2=60°$. Although in this preferred embodiment the angle $\theta_3$ is made 45°, the angle $\theta_3$ can be set to an angle smaller than the previously set angle $\theta_2$ anywhere within a range of about 0° to 70°.

When an N-type impurity is implanted into the P-type region lower parts 8b in this way, the implanted P-type impurity and N-type impurity cancel each other out and the substantial impurity concentration (net value) of the P-type region lower parts 8b falls.

Figure 9:
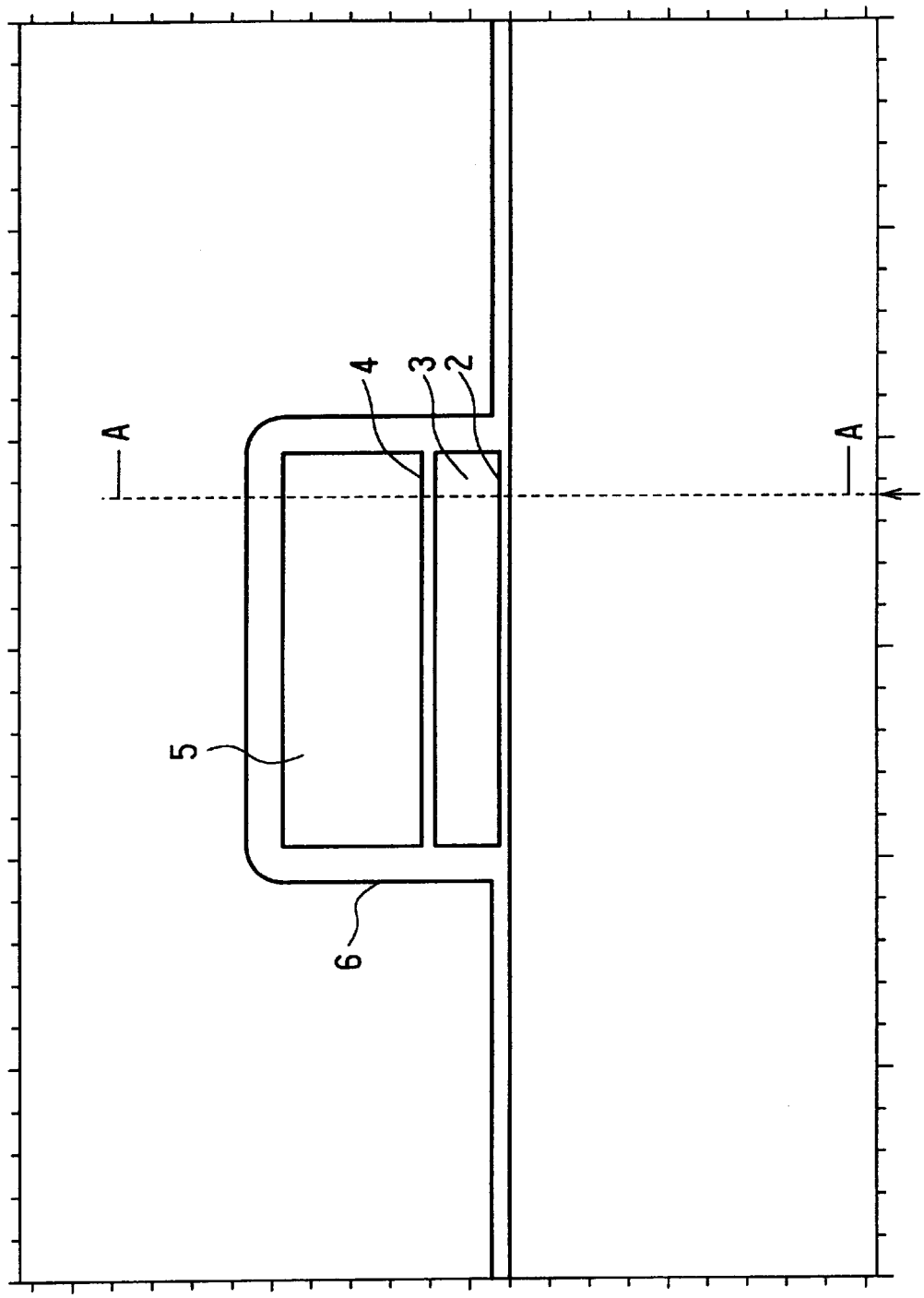
FIG. 9 is a schematic view of a flash memory transistor.
Figure 12A:
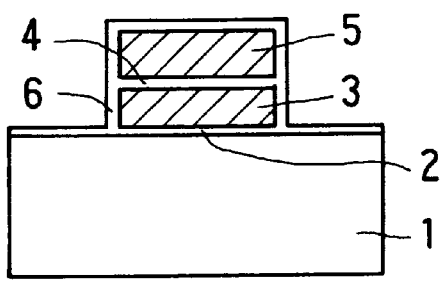
FIGS. 12A through 12D are process views illustrating a procedure for manufacturing a conventional flash memory transistor.
Figure 12B:
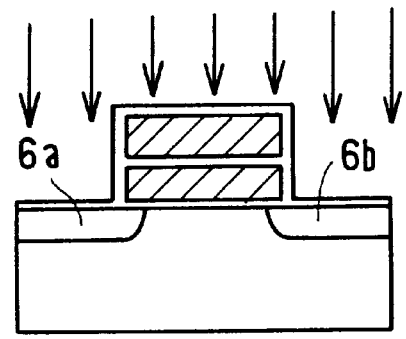
Figure 12C:
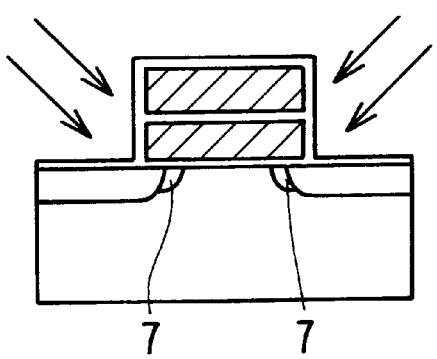
Figure 12D:
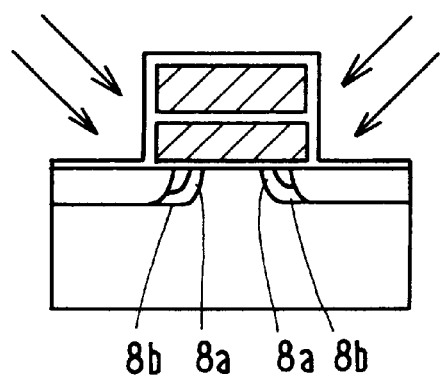

Specifically, the impurity concentration characteristic on the line A—A of the flash memory transistor shown in FIG. 9 is shown in FIG. 10 and FIG. 11. FIG. 10 is an impurity concentration characteristic chart of before the phosphorus ion implantation and FIG. 11 is an impurity concentration characteristic chart of after the phosphorus ion implantation. As shown in FIG. 10 and FIG. 11, the net impurity concentration in the P-type region lower part 8b is lower after the phosphorus ion implantation.

Also, if the acceleration voltage at the time of implantation is set so that the implanted phosphorus ions mainly reach the P-type region lower parts 8b, the net impurity concentration of the P-type region lower parts 8b can be made the same as the P-type semiconductor substrate 1. In other words, the P-type region lower parts 8b can be completely cancelled.

Figure 8F:
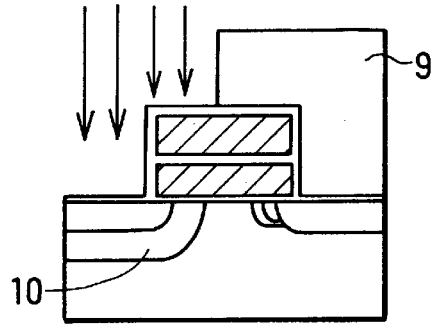
Figure 8G:
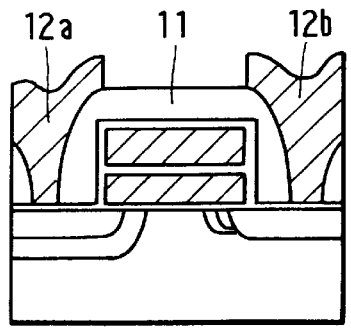

Then, in the same way as in the first preferred embodiment, as shown in FIG. 8F, the drain 6b side is covered with a photoresist 9 and phosphorus ions are implanted into the source 6a side to form a source electric-field moderating layer 10 for securing a high source withstandable voltage. Then, as shown in FIG. 8G, an interlayer insulating film 11 such as a BPSG film is formed and contact holes are opened in this interlayer insulating film 11 and a source electrode 12a and a drain electrode 12b are formed and the flash memory transistor is thereby completed.

As described above, by implanting an N-type impurity at a predetermined angle $\theta_3$ it is possible to lower the concentration of the P-type region lower parts 8b still more effectively and it is possible to form a P-pocket structure having only the concentration of the P-type region side parts 8a made high. By this means, the same effects as those of the first preferred embodiment can be obtained even more effectively.

This method of adjusting the net impurity concentration in the P-type region lower parts 8b by implanting phosphorus ions or the like into them is particularly useful in cases such as when a sufficient ion implantation angle $\theta_2$ cannot be obtained because the bits of the flash memory transistor are too close together since in a flash memory transistor normally many bits are formed at the same time.

In this preferred embodiment, the size relationship between the angle $\theta_1$ and the angle $\theta_2$ does not have to be $\theta_1<\theta_2$ as shown in the first preferred embodiment, and for example may alternatively be $\theta_1=\theta_2$. Specifically, because after boron ion implantation is carried out with the acceleration voltage and the dose adjusted so that the P-type regions 8 can be formed around the field-moderating layers 7 the angle $\theta_3$ can be adjusted to match that, the angle $\theta_1$ may even be greater than the angle $\theta_2$.

In the first and second preferred embodiments, a P-type semiconductor is used for the semiconductor substrate 1 and the source 6a, the drain 6b and the electric-field moderating layers 7 are all made using N-type impurities; however, alternatively an N-type semiconductor may be used for the semiconductor substrate 1 and the source 6a and so on then formed using a P-type impurity. Also, when necessary, a well region may be formed and the semiconductor memory device shown in the first or second preferred embodiment described above then formed in the well region.

(Third Preferred Embodiment)

A third preferred embodiment of the present invention will now be described.

FIGS. 13A through 13D are process views illustrating a method for manufacturing a two-layer gate type semiconductor memory device in this preferred embodiment. This preferred embodiment relates to an improvement of the process of the first and second preferred embodiments of forming a floating gate and a control gate (FIGS. 2A and 8A).

Figure 13A:
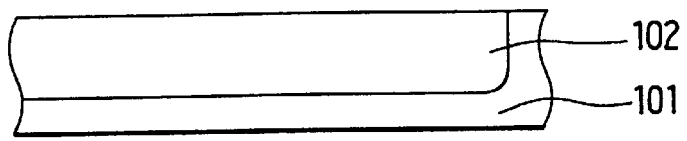
FIGS. 13A through 13D are process views illustrating a procedure for manufacturing a two-layer gate type semiconductor memory device according to a third preferred embodiment of the present invention.
Figure 13B:
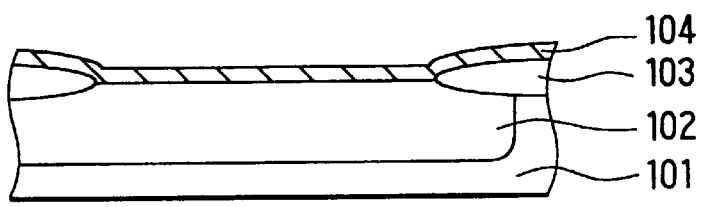

First, ions are implanted into a silicon substrate 101 to form a P-type well layer 102 in the silicon substrate 101, as shown in FIG. 13A. Then, after a LOCOS film 103 for device separation is selectively formed, an oxide film of thickness about 100 to 120 Å is formed on the P-type well layer 102 and nitriding is carried out to form a tunnel film 104, as shown in FIG. 13B.

Figure 13C:
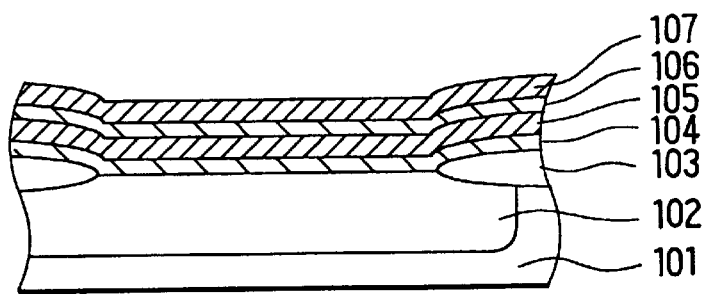

Next, after ion implantation for threshold value adjustment is carried out, as shown in FIG. 13C, on the tunnel film (first insulating film) 104 are successively formed a polysilicon layer (first gate electrode layer) 105, an insulating film made up of an oxide film/nitride film/oxide film three-layer structure (second insulating film) 106, and a polysilicon layer (second gate electrode layer) 107.

Figure 13D:
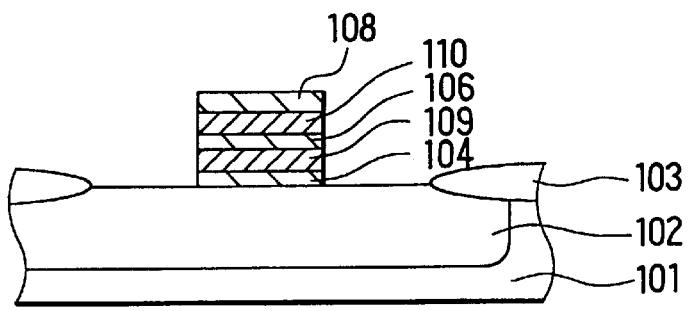

Then, a photoresist (resist film) 108 is deposited on a part to become a gate. With this photoresist 108 as a mask, anisotropic dry etching is carried out using a chorine gas to form a floating gate 109 and a control gate 110. At this time, the duration of the anisotropic dry etching is selected so that except for the masked part the tunnel film 104 is completely removed and the P-type well layer 102 is completely exposed, as shown in FIG. 13D.

Figure 14A:
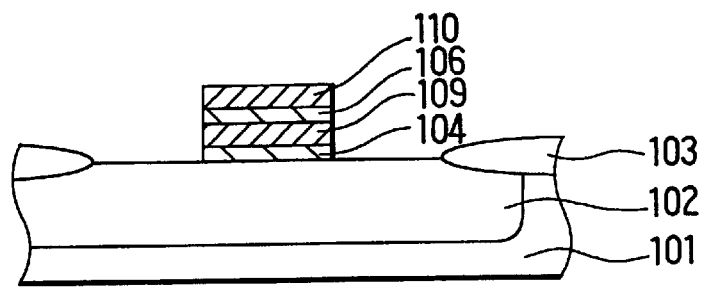
FIGS. 14A through 14C are process views following on from FIG. 13D illustrating a procedure for manufacturing a two-layer gate type semiconductor memory device.

After that, isotropic dry etching is carried out and by $O_2$ ashing and washing the photoresist 108 is removed as shown in FIG. 14A. However, this isotropic dry etching is a step for removing the photoresist 108 only, and does not remove the tunnel film 104 at all and has no affect on rounding of the drain 113 side edge of the floating gate 109.

Figure 14B:
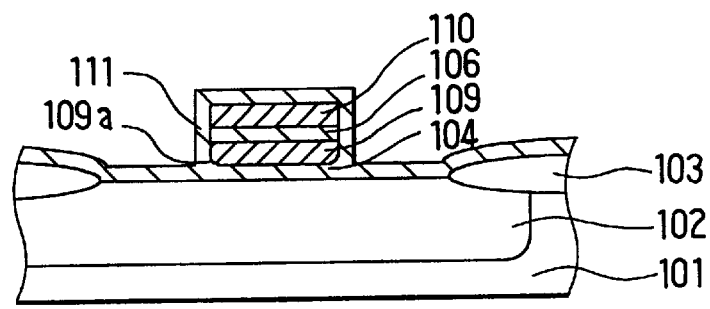

After that, thermal oxidation is carried out to form a side wall oxide film 111. At this time, oxidation progresses as far as the edges 109a of the floating gate 109 and the edges 109a of the floating gate 109 become rounded, as shown in FIG. 14B.

Figure 14C:
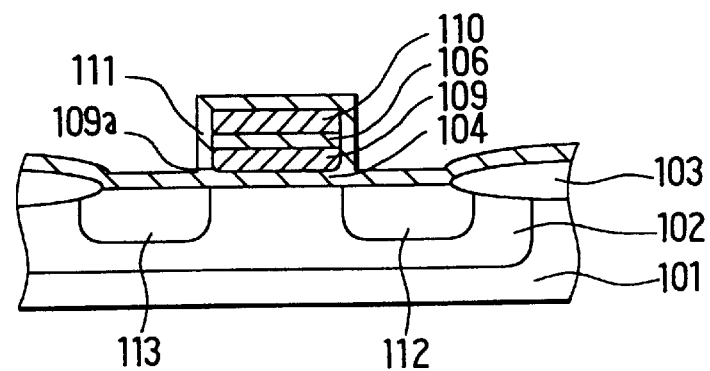

Then, with these gate electrodes 109, 110 as a mask, ion implantation is carried out to form a source 112 and a drain 113, as shown in FIG. 14C. After that, aluminum interconnections (not shown) connected to the electrodes are formed by patterning, and the two-layer gate type semiconductor memory device is thereby completed.

The present inventors produced by way of a trial and carried out studies on two-layer gate type semiconductor memory devices made with a single anisotropic dry etching step for the rounding of the drain side edge of the floating gate carried out to suppress drain disturbance.

Characteristics obtained when the over-etching time after the first gate electrode layer 105 is removed by this anisotropic dry etching was varied are shown in FIGS. 15A through 15F and FIG. 16.

FIGS. 15A through 15F are graphs showing, for each of several different over-etching times, threshold voltages of when a voltage of 5V was applied to the drain 113 for 1.0 sec in a 16-bit two-layer gate type semiconductor memory device having had its threshold voltage brought to 7.5V by writing operation, and show the average value of the threshold voltage at that time and the value of tripling the standard deviation (standard deviation×3).

When the two-layer gate type semiconductor memory device is formed by the same procedure as that described above, the probability of the threshold voltages of the two-layer gate type semiconductor memory device being within the average value±the standard deviation×3 is 99.7%. Therefore, this standard deviation serves as a guide of dispersion of threshold voltages in the two-layer gate type semiconductor memory device.

Figure 16:
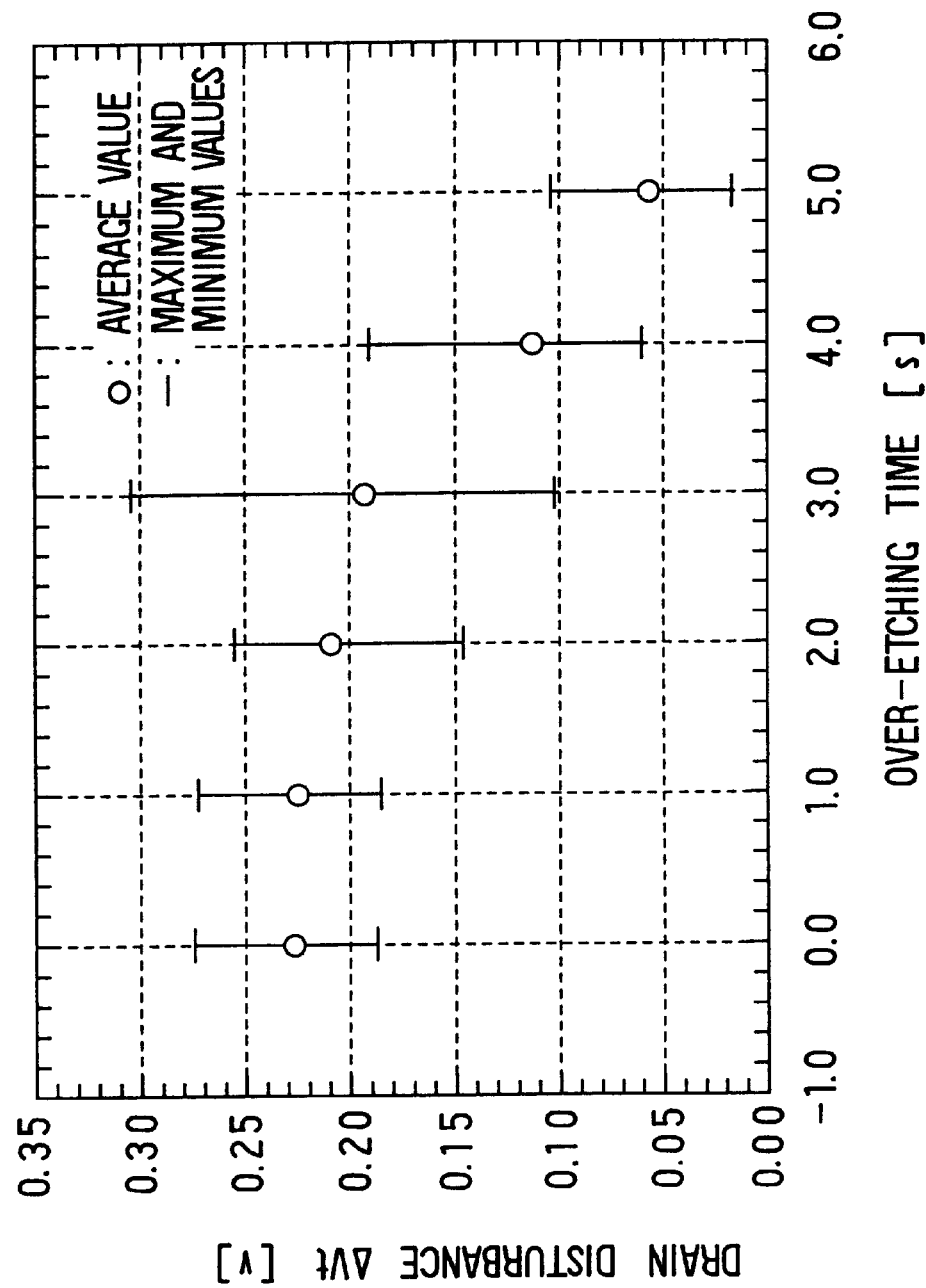
FIG. 16 is a characteristic chart of an over-etching time in FIGS. 14A through 14C vs. threshold voltage.

FIG. 16 shows, for the threshold voltages in FIGS. 15A through 15F, the arithmetical mean of 16 bits and the maximum and minimum values among the 16 bits. The variation of the threshold voltages serves as a guide to the drain disturbance characteristics, and for example the larger the variation of the threshold voltages is the poorer the drain disturbance characteristic becomes. The calculation of the arithmetical mean was carried out on the basis of the following equation (1). Here, X is the average, xi is the threshold voltage of any 1 bit, and n is the number of bits (in this preferred embodiment, n=16).

$$X = \sum_{i=1}^{n} x_i / n \qquad 40$$

Figure 17A:
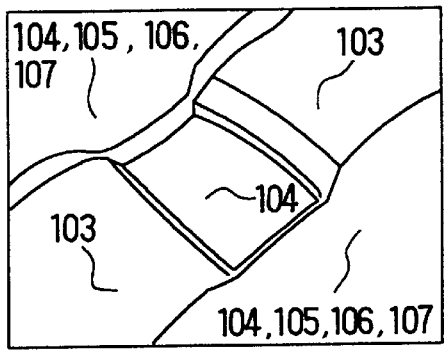
FIGS. 17A through 17D are schematic views showing degrees of exposure of a silicon substrate when a tunnel film has been etched.

FIGS. 17A through 17D are schematic views illustrating degrees of exposure of the P-type well layer 102 in the substrate 101 corresponding to the etching times of FIGS. 15A through 15F. FIG. 17A shows a case wherein the over-etching time is insufficient and the P-type well layer 102 in the substrate 101 is not exposed at all. This kind of state corresponds to FIGS. 15A through 15C and the over-etching time in FIG. 16 being about 0.0 to 2.0 seconds. In this case, the average value of the variation in the threshold voltages of the 16 bits is large, which is undesirable in terms of device performance.

Figure 17B:
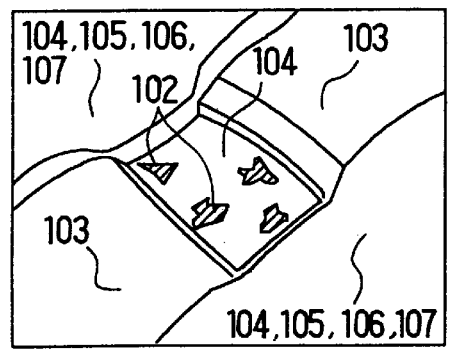

FIG. 17B shows a case wherein the P-type well layer 102 on the drain 113 side has started to be exposed. This state corresponds to the over-etching time of about 3.0 seconds of FIG. 15D and in FIG. 16. In this case, because considerable dispersion arises in the exposure of the the P-type well layer 102, there is considerable dispersion in the threshold voltages of the 16 bits.

Figure 17C:
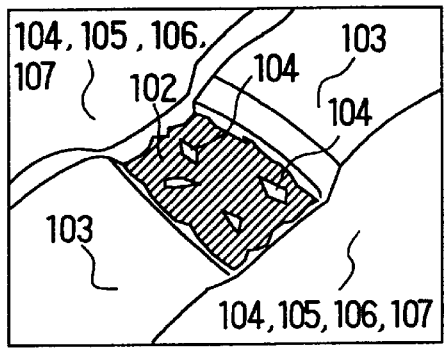

FIG. 17C shows a case wherein the P-type well layer 102 on the drain 113 side is mostly exposed. This case corresponds to the over-etching time of about 4.0 seconds of FIG. 15E and in FIG. 16. The variation in the threshold voltages of the 16 bits is smaller than in the case of the state shown in FIG. 17B.

Figure 17D:
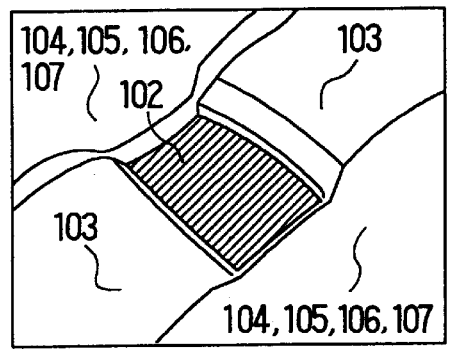
Figure 18:
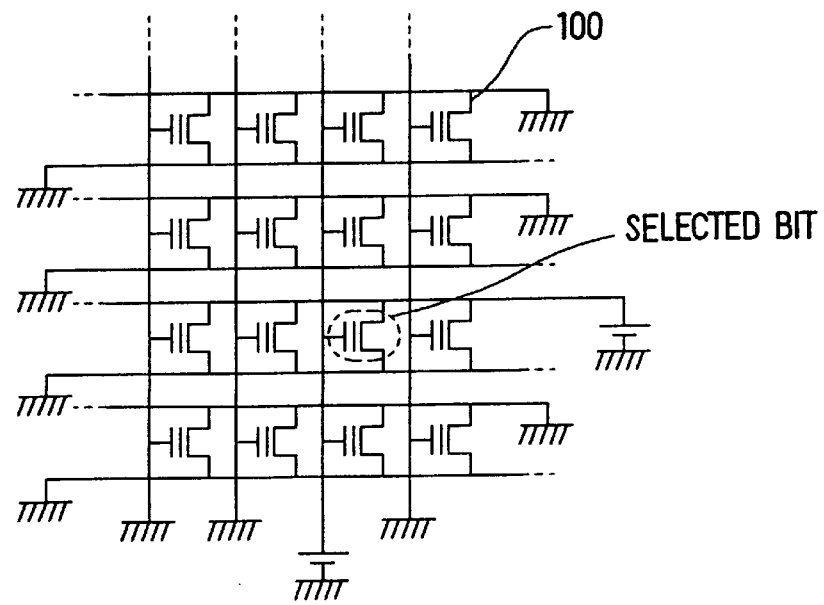
FIG. 18 is a schematic view of an array of two-layer gate type semiconductor memory devices.

FIG. 17D shows a case wherein the P-type well layer 102 on the drain 113 side is completely exposed. This state corresponds to the over-etching time of about 5.0 seconds of FIG. 15F and in FIG. 16. In this case, the variation in the threshold voltages of the 16 bits is considerably smaller than in the case of the state shown in FIG. 17B, and the dispersion of the threshold voltages is smaller.

As shown in FIGS. 15A through 15F, when the over-etching time after the first gate electrode layer 105 is removed is extended to longer than 3.0 seconds, the average value of the threshold voltages is rapidly decreased. Also, with regard to the difference between the maximum value and the minimum value, although for a while it increases as the over-etching time is extended, it then decreases again as the over-etching time is extended further. Therefore, to make the average value of the threshold voltages small without the dispersion thereof being large all that is necessary is to remove the tunnel film 104 with the over-etching time being sufficiently lengthened so that at least the p-type well layer 102 in the substrate 101 on the drain 113 side is completely exposed, and by this means it is possible to improve the drain disturbance characteristic. Using the method described above, with a single etching step it is possible to round the edge 109a on the drain 113 side of the floating gate 109 and improve the drain disturbance characteristic.

In this preferred embodiment the P-type well layer 102 is formed in the silicon substrate 101, but the method is not limited to this and alternatively a substrate made of a P-type conducting material may be used instead, and the same applies when an N-type conducting material is used. In this case also, as in the present preferred embodiment, it is necessary for the anisotropic etching in forming the floating gate 109 and the control gate 110 to be carried out until the silicon substrate surface is completely exposed.

What is claimed is:

1. A semiconductor memory device comprising:
    a semiconductor substrate of a first conductivity type;
    a source region of a second conductivity type disposed in said semiconductor substrate;
    a drain region of the second conductivity type disposed in said semiconductor substrate to be spaced from said source region;
    a floating gate disposed over a portion of said semiconductor substrate between said source region and said drain region;
    a control gate disposed to overlap with said floating gate with an insulation film interposed;
    a first impurity region of the second conductivity type disposed under said floating gate in contact with said drain region and spaced from said source region, said first impurity region having an impurity concentration lower than that of said drain region; and
    a second impurity region of the first conductivity type disposed under said floating gate to encompass at least said first impurity region, said second impurity region having an impurity concentration higher than said semiconductor substrate and creating a PN junction in association with said first impurity region so that a net impurity concentration of the first conductivity type along said PN junction is higher at a first region contacting a side of said first impurity region than a second region contacting a bottom of said first impurity region.

2. A semiconductor memory device according to claim 1, wherein said net impurity concentration of the first conductivity type at said second region is higher than an impurity concentration of said semiconductor substrate.

3. A semiconductor memory device according to claim 1, further comprising a third impurity region of the second conductivity type disposed under said floating gate in contact with said source region and spaced from said drain, first and second impurity regions, said third impurity region having an impurity concentration lower than that of said source region.

4. A semiconductor memory device according to claim 3, wherein said third impurity region encompass said source region.

5. A semiconductor memory device according to claim 1, wherein the first conductivity type is a P-type, and the second conductivity type is an N-type.

6. A semiconductor memory device comprising:

a semiconductor substrate of a first conductivity type;

a source region of a second conductivity type disposed in said semiconductor substrate;

a drain region of the second conductivity type disposed in said semiconductor substrate to be spaced from said source region;

a floating gate disposed over a portion of said semiconductor substrate between said source region and said drain region;

a control gate disposed to overlap with said floating gate with an insulation film interposed;

a first impurity region of the second conductivity type disposed under said floating gate in contact with said drain region and spaced from said source region, said first impurity region having an impurity concentration lower than that of said drain region; and a second impurity region of the first conductivity type disposed under said floating gate to encompass at least said first impurity region, said second impurity region having an impurity concentration higher than said semiconductor substrate and having a profile of a net impurity concentration of the first conductivity type that causes a depletion layer narrower at a first region contacting a side of said first impurity region than a second region contacting a bottom of said first impurity region.

7. A semiconductor memory device according to claim 6, wherein said net impurity concentration of the first conductivity type at said second region is higher than an impurity concentration of said semiconductor substrate.

8. A semiconductor memory device according to claim 6, further comprising a third impurity region of the second conductivity type disposed under said floating gate in contact with said source region and spaced from said drain, first and second impurity regions, said third impurity region having an impurity concentration lower than that of said source region.

9. A semiconductor memory device according to claim 8, wherein said third impurity region encompasses said source region.

10. A semiconductor memory device according to claim 6, wherein the first conductivity type is a P-type, and the second conductivity type is an N-type.

* * * * *